United States Patent
Coyle

(10) Patent No.: US 6,541,832 B2
(45) Date of Patent: Apr. 1, 2003

(54) PLASTIC PACKAGE FOR MICROMECHANICAL DEVICES

(75) Inventor: Anthony L. Coyle, Plano, TX (US)

(73) Assignee: Texas Instruments Incorporated, Dallas, TX (US)

(*) Notice: Subject to any disclaimer, the term of this patent is extended or adjusted under 35 U.S.C. 154(b) by 0 days.

(21) Appl. No.: 09/766,197

(22) Filed: Jan. 19, 2001

(65) Prior Publication Data

US 2002/0000630 A1 Jan. 3, 2002

Related U.S. Application Data

(60) Provisional application No. 60/179,181, filed on Jan. 31, 2000.

(51) Int. Cl.[7] ............................ H01L 29/78; H01L 33/00
(52) U.S. Cl. ........................................ 257/415; 257/416
(58) Field of Search ............................... 257/415, 416, 257/417, 418

(56) References Cited

U.S. PATENT DOCUMENTS 5,936,758 A * 8/1999 Fisher et al.

* cited by examiner

*Primary Examiner*—Stephen D. Meier
(74) *Attorney, Agent, or Firm*—Michael K. Skrehot; Wade James Brady, III; Frederick J. Telecky, Jr.

(57) ABSTRACT

Low-cost plastic cavity-up land-grid array packages and ball-grid array packages are provided, suitable for wire-bonded chips having micromechanical components. The packages feature a thermal heat spreader and a protective lid. The package structure disclosed is flexible with regard to materials and geometrical detail, and provides solutions to specific functions such as storage space for chemical compounds within the enclosed cavity of the package.

12 Claims, 1 Drawing Sheet

PLASTIC PACKAGE FOR MICROMECHANICAL DEVICES

This application claims the benefit of Ser. No. 60/179,181, filed Jan. 31, 2000.

FIELD OF THE INVENTION

The present invention is related in general to the field of semiconductor devices and processes and more specifically to the design and fabrication of a plastic land-grid array package generally for micromechanical devices and specifically for digital mirror devices.

DESCRIPTION OF THE RELATED ART

Micromechanical devices include actuators, motors, sensors, spatial light modulators (SLM), digital micromirror devices or deformable mirror devices (DMD), and others. The technical potential of these devices is especially evident when the devices are integrated with semiconductor circuitry using the miniaturization capability of semiconductor technology.

SLMs are transducers that modulate incident light in a special pattern pursuant to an electrical or other input. The incident light may be modulated in phase, intensity, polarization or direction. SLMs of the deformable mirror class include micromechanical arrays of electronically addressable mirror elements or pixels, which are selectively movable or deformable. Each mirror element is movable in response to an electrical input to an integrated addressing circuit formed monolithically with the addressable mirror elements in a common substrate. Incident light is modulated in direction and/or phase by reflection from each element.

As set forth in greater detail in commonly assigned U.S. Pat. No. 5,061,049, issued on Oct. 29, 1991 (Hornbeck, "Spatial Light Modulator and Method"), deformable mirror SLMs are often referred to as DMDs in three general categories: elastomeric, membrane, and beam. The latter category includes torsion beam DMDs, cantilever beam DMDs, and flexure beam DMDs. Each movable mirror element of all three types of beam DMD includes a relatively thick metal reflector supported in a normal, undeflected position by an integral, relatively thin metal beam. In the normal position, the reflector is spaced from a substrate-supported, underlying control electrode, which may have a voltage selectively impressed thereon by the addressing circuit.

When the control electrode carries an appropriate voltage, the reflector is electrostatically attracted thereto and moves or is deflected out of the normal position toward the control electrode and the substrate. Such movement or deflection of the reflector causes deformation of its supporting beam storing therein potential energy which tends to return the reflector to its normal position when the control electrode is de-energized. The deformation of a cantilever beam comprises bending about an axis normal to the beam's axis. The deformation of a torsion beam comprises deformation by twisting about an axis parallel to the beam's axis. The deformation of a flexure beam, which is a relatively long cantilever beam connected to the reflector by a relatively short torsion beam, comprises both types of deformation, permitting the reflector to move in piston-like fashion.

A typical DMD includes an array of numerous pixels, the reflectors of each of which are selectively positioned to reflect or not to reflect light to a desired site. In order to avoid an accidental engagement of a reflector and its control electrode, a landing electrode may be added for each reflector. It has been found, though, that a deflected reflector will sometimes stick or adhere to its landing electrode. It has been postulated that such sticking is caused by intermolecular attraction between the reflector and the landing electrode or by high surface energy substances adsorbed on the surface of the landing electrode and/or on the portion of the reflector which contacts the landing electrode. Substances which may impart such high surface energy to the reflector-landing electrode interface include water vapor or other ambient gases (e.g., carbon monoxide, carbon dioxide, oxygen, nitrogen) and gases and organic components resulting from or left behind following production of the DMD. A suitable DMD package is disclosed in commonly assigned U.S. Pat. No. 5,293,511 issued on Mar. 8, 1994 (Poradish et al., "Package for a Semiconductor Device").

Sticking of the reflector to the landing electrode has been overcome by applying selected numbers, durations, shapes and magnitudes of voltages pulses to the control electrode. Detail can be found in U.S. Pat. No. 5,096,279, issued on Mar. 17, 1992 (Hornbeck et al., "Spatial Light Modulator and Method"). Further improvement of the sticking problem is disclosed in commonly assigned U.S. Pat. No. 5,331,454, issued on Jul. 19, 1994 (Hornbeck, "Low Reset Voltage Process for DMD"). This patent describes a technique for passivating or lubricating the portion of the landing electrode engaged by the deformed reflector, and/or the portion of the deformed reflector which engages the landing electrode. Passivation is effected by lowering the surface energy of the landing electrode and/or the reflector, which is, in turn, effected by chemically vapor-depositing on the engageable surfaces a monolayer of a long-chain aliphatic halogenated polar compound, such as perfluoroalkyl acid. Objects do not easily, if at all, stick or adhere to low energy surfaces, which are also usually expected to be resistant to sorption thereonto of high surface-energy imparting substances such as water vapor.

Refinements of the passivation method are disclosed in U.S. Pat. No. 5,939,785, issued on Aug. 17, 1999 (Klonis et al., "Micromechanical Device including Time-release Passivant"), and U.S. Pat. No. 5,936,758, issued on Aug. 10, 1999 (Fisher et al., "Method of Passivating a Micromechanical Device within a Hermetic Package"). The method an enclosed source time-releasing a passivant, preferably a molecular sieve or binder impregnated with the passivant. Further, the method is placing a predetermined quantity of the passivant in the package just after device activation, and is then immediately welding a hermetic lid (free of passivant during the welding process) to the package.

Today's overall package structure for micromechanical devices, based on multi-level metallization ceramic materials, and method of fabrication is expensive. This fact conflicts with the market requirements for many applications of micromechanical devices, which put a premium at low device cost and, therefore, low package cost.

An urgent need has therefore arisen for a coherent, low-cost method of encapsulating micromechanical chips and for a low cost reliable package structure. The structure should be flexible enough to be applied for different micromechanical product families and a wide spectrum of design and process variations. Preferably, these innovations should be accomplished while shortening production cycle time and increasing throughput.

SUMMARY OF THE INVENTION

According to the present invention, a low-cost plastic cavity-up land-grid array and ball-grid array package is provided, suitable for wire-bonded chips having micromechanical components, and featuring a thermal heat spreader and a protective lid. The package structure disclosed is flexible with regard to materials and geometrical detail such as storage space for chemical compounds within the enclosed cavity of the package.

It is an aspect of the present invention to be applicable to a variety of different semiconductor micromechanical devices, for instance actuators, motors, sensor, spatial light modulators, and deformable mirror devices. In all applications, the invention achieves technical advantages as well as significant cost reduction and yield increase.

In a key embodiment of the invention, the micromechanical components are micromirrors for a digital mirror device. In this case, the lid is a plate made of glass or any other material transparent to light.

Another aspect of the invention is be applicable to a wide variety of substrates, made either of stiff or partially flexible material, such as polymer-based boards having multi-level metallization. Additional flexibility is provided by the variations of the laminations of the substrate and the routing lines integral with the substrate.

Another aspect is the flexibility of the package interface with other part or the "outside world"; the options include package designs as land grid array, ball grid array (including generally solder bump), and pin grid array.

Another aspect of the invention is to provide flexibility of the package structure relative to the geometry (contour and area) of the semiconductor chip containing the plurality of micromechanical components, and the lengths and span shapes of the interconnecting bonding wires.

These aspects have been achieved by the teachings of the invention concerning structure, thermal performance, and means for interconnection suitable for mass production.

The technical advances represented by the invention, as well as the aspects thereof, will become apparent from the following description of the preferred embodiments of the invention, when considered in conjunction with the accompanying drawings and the novel features set forth in the appended claims.

DETAILED DESCRIPTION OF THE PREFERRED EMBODIMENTS

Figure 1:
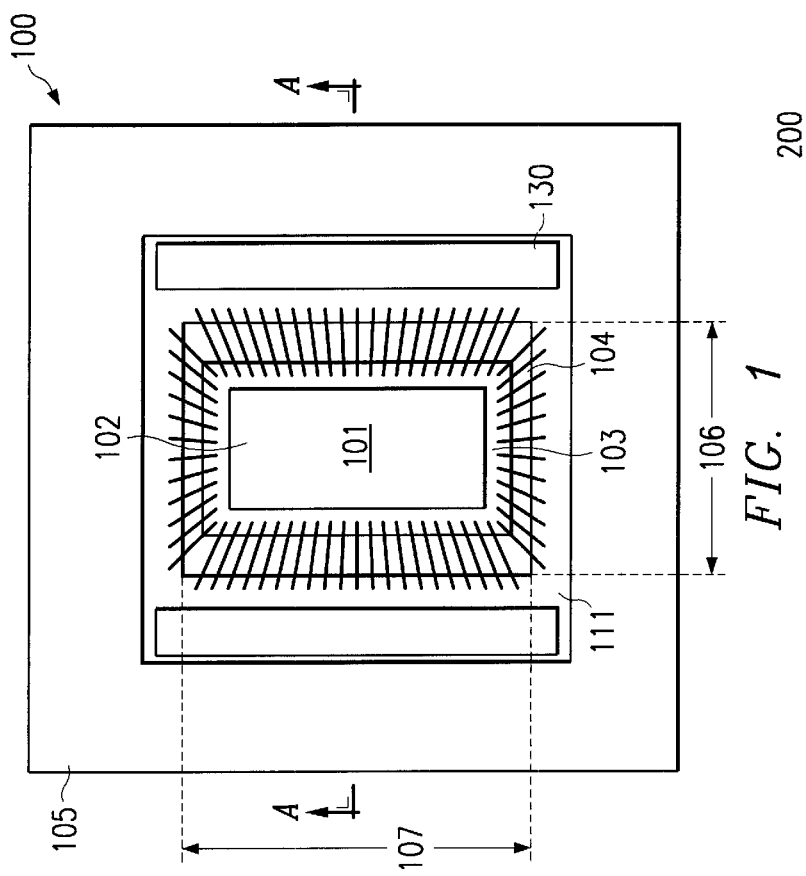
FIG. 1 is a schematic top view of the package for micromechanical devices according to the invention, with the chip assembled inside the package. The package lid is transparent.
Figure 2:
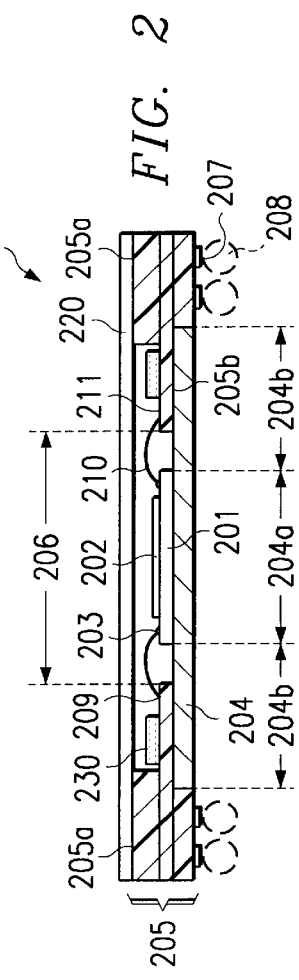
FIG. 2 is a schematic cross section through the package, chip and lid of FIG. 1 along lines A—A.

FIG. 1 illustrates a schematic top view of the plastic package generally designated 100, for semiconductor micromechanical devices according to the invention. FIG. 2 illustrates a schematic cross section of the package along lines A—A in FIG. 1. As FIG. 2 shows, the package belongs generally to the huge class of surface mount packages, and specifically to the family of "Land Grid Array" and "Ball Grid Array" packages. The position of the semiconductor chip relative to the connection to the "outside world" (lands or balls, respectively) categorizes the package as a "cavity down" model.

In the top view of FIG. 1, the semiconductor chip 101 is depicted with its integrated circuit (IC) facing upwards. Chip 101 is formed on and in a single-crystalline material, typically silicon. The material may also be silicon germanium, gallium arsenide, or any other semiconductor material used for device production. The IC includes the plurality 102 of micromechanical components, located in the central portion of the chip. The IC further includes the plurality 103 of bonding pads as input/output terminals of the IC and the micromechanical components, located in the peripheral portion of the chip.

The micromechanical components 102 may include actuators, motors, sensors, spatial light modulators, and deformable mirror devices. By way of example and purposes of illustration, micromechanical components 102 are digital micromirror devices (DMD), as manufactured by Texas Instruments Incorporated, Dallas, Tex., U.S.A.

In FIG. 2, the plastic package for micromechanical devices is generally designated 200. Illustrated in cross section, the semiconductor chip 201 has the IC with the plurality of micromechanical components 202 facing upward. Furthermore, the micromechanical components 202 are configured in a plane in the central portion of chip 201. In addition, chip 201 includes the plurality 203 of bonding pads, located in the peripheral portion of the chip.

Chip 201 is attached to a support means 204. In the preferred embodiment of the invention, support 204 is made of a material of excellent thermal conductivity so that it functions as a heat spreader for distributing thermal energy generated by the micromechanical components in operation. Preferably, support 204 is also a good heat sink. If the micromechanical components 202 are micromirrors, a slab of copper can serve both as heat spreader and heat sink.

As the cross sectional view of FIG. 2 shows, support 202 is designed so that its central area 204a provides the region for attaching chip 201, while the peripheral areas 204b provide regions for attaching the plastic frame of the package. The attachment of chip 201 is typically performed with a polymerizable epoxy or polyimide adhesive, which is standard in semiconductor technology. In the top view of FIG. 1, only a portion of the support is visible, denoted as 104.

Referring now to FIG. 1, a pivotal part of the package of the present invention is plastic frame 105. In the preferred embodiment, frame 105 is made of several sheet-like laminations of electrically insulating material, which serve various purposes. As one feature, a plurality of electrically conductive routing lines is integral with the electrically insulating layers. This is accomplished by laminating an electrically conductive layer (for example, a copper foil) between the insulating layers and patterning this conductive layer into the plurality of routing lines.

There is a considerable variety of plastic materials and thicknesses for the laminations of frame 105. The materials may be selected from a group consisting of polymer sheets made of polyimides or epoxies, or board-like formats such as FR-4, FR-5, BT resin, or glass-fiber strengthened dielectrics. Commercial sources for these insulating sheets and boards are, for instance, Kyocera, Japan, and Sheldahl, Inc., Northfield, Minn., U.S.A. These materials are typically fabricated by laminating alternating sheets of electrically insulating and electrically conducting materials into one coherent board.

A key feature of frame 105 is the central opening indicated by its lateral dimensions 106 and 107. As FIG. 1 shows, the outline of the opening simulates the contours of chip 101, yet has to employ larger dimensions in order to accommodate the distances consumed by wire length portions in bonding wire assembly.

In FIG. 2, plastic frame 205 is shown having first surface 205a and second surface 205b. FIG. 2 also shows the central opening of the frame by indicating one linear dimension 206 of the opening.

It is essential for the present invention that the first surfaces 205a are flat and in a plane parallel to the plane of the plurality 202 of the micromechanical components, since the first surfaces 205a serve the attachment of the package lid. The parallelity is required for proper functioning of several micromechanical devices, such as micromirror devices or microsensors.

The second surface 205b is adhered to part of the peripheral areas 204b of the support 204. This attachment has to be performed such that the support 204 completely closes up one level of the opening of the frame. As can be seen in FIG. 2, this condition is achieved easily when the second surface 205b and the support 204 overlap by a wide margin—a design suggested to maximize the heat dissipating function of support 204. Typical attachment materials are standard epoxy and polyimide adhesives.

Another essential feature of the present invention is the plurality of terminals 207 disposed in the second surface 207 of the plastic frame, or an extension thereof at the elevation of support 204. Each terminal is in electrical contact with at least one respective routing line and thus acts as an input/output for the packaged devices. Typically, terminals 207 are made of copper, sometime having a surface made of a flash of gold.

Figure 3:
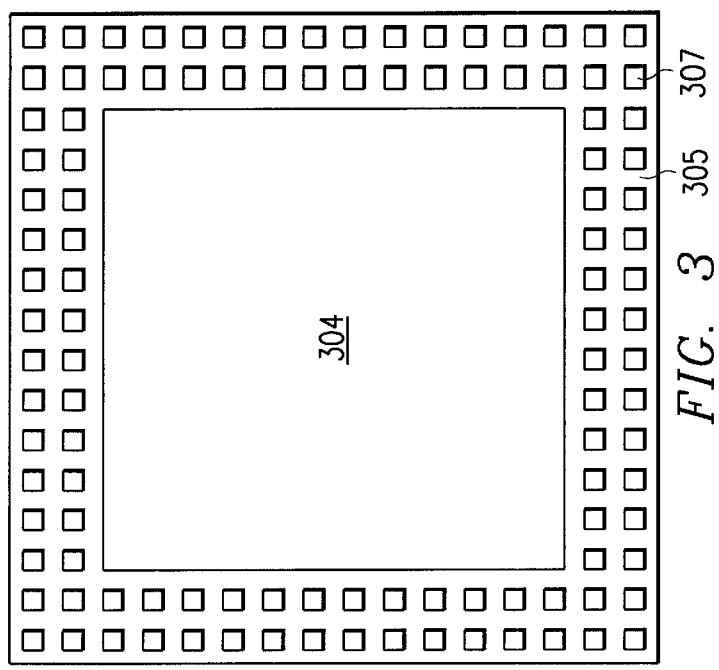
FIG. 3 is a schematic bottom view of the package for micromechanical devices according to the invention, with heat spreader attached.

When the terminals are facing away from the orientation of the integrated circuit, the package type is referred to as "cavity up". When solder balls 208 are attached to the terminals, the package is classified as a "Ball Grid Array" package. Without the solder balls 208, the package is classified as a "Land Grid Array" package. FIG. 3 offers a bottom view of a micromechanical device package in the "Land Grid Array" configuration. The terminals are arranged as an array of square-shaped pads 307 around the periphery of the package, embedded in or slightly elevated from plastic frame 305. Support 304 is shown in the central portion of the package.

Solder balls 208, depicted in dashed lines in FIG. 2 to emphasize their optional application, serve as connections to other parts or to circuit/mother boards. As used herein, the term solder "ball" does not imply that the solder contacts are necessarily spherical; they may have various forms, such as semispherical, half-dome, truncated cone, or generally bump, or a cylinder with straight, concave or convex outlines. The exact shape is a function of the deposition technique (such as evaporation, plating, or prefabricated units) and reflow technique (such as infrared or radiant heat), and the material composition. Generally, a mixture of lead and tin is used; other materials include indium, alloys of tin/indium, tin silver, tin/bismuth, or conductive adhesive compounds. The melting temperature of the solder balls used for chip 110 may be different from the melting temperature of the solder balls used for the other chip, or the solder balls used for connecting the module to the outside world. Several methods are available to achieve consistency of geometrical shape by controlling amount of material and uniformity of reflow temperature. Typically, the diameter of the solder balls ranges from 0.2 to 1.0 mm, but can be significantly larger.

In FIG. 2, wire ball bonding is employed to connect a chip bonding pad 203 to the endpoint 209 of a routing line integral with the plastic substrate 205. Wire bonding is the preferred method of using coupling members to create electrical interconnections between the plurality of chip bonding pads and the plurality of routing lines. Another method is ribbon bonding employing wedge bonders. In contrast to wedge bonding, ball bonding operates at elevated temperatures which need to be harmonized with the materials and processes used of the package of the present invention.

The wire bonding process begins by positioning both chip and substrate on a heated pedestal to raise their temperature to between 170 and 300° C. A high 210 typically of gold, gold-beryllium alloy, other gold alloy, or copper, having a diameter typically ranging from 18 to 33 $\mu$m, is strung through a heated capillary where the temperature usually ranges between 200 and 500° C. At the tip of the wire, a free air ball is created using either a flame or a spark technique. The ball has a typical diameter from about 1.2 to 1.6 wire diameters. The capillary is moved towards the chip bonding pad 203 and the ball is pressed against the metallization of the bonding pad (typically aluminum, aluminum-copper alloy, or copper). For pads of aluminum, a combination of compression force and ultrasonic energy creates the formation of gold-aluminum intermetallics and thus a strong metallurgical bond. At time of bonding, the temperature usually ranges from 150 to 270° C. In the case of copper wire on copper pad, only metal interdiffusion takes places in order to generate the strong weld.

It is important for the present invention that recent technical advances in wire bonding now allow the formation of small yet reliable ball contacts and tightly controlled shape of the wire loop. Ball pitches as small as between 75 and 40 $\mu$m can be achieved. Such advances can, for instance, be found in the computerized bonder 8020 by Kulicke & Soffa, Willow Grove, Pa., U.S.A., or in the ABACUS SA by Texas Instruments, Dallas, Tex., U.S.A. Moving the capillary in a predetermined and computer-controlled manner through the air will create a wire looping of exactly defined shape. For instance, with recent technical advance, rounded, trapezoidal, linear and customized loop paths can be formed. Finally, the capillary reaches its desired destination, for instance routing line pad 209. The capillary is lowered to touch the pad; with an imprint of the capillary, a metallurgical stitch bond is formed, and the wire is flamed off to release the capillary. Stitch contacts are small yet reliable; the lateral dimension of the stitch imprint is about 1.5 to 3 times the wire diameter (its exact shape depends on the shape of the capillary used, such as capillary wall thickness and capillary footprint). Consequently, the area of the routing line pads 209 can be designed small.

It is further important for the present invention that recent technical advances allow the formation of the wire looping with a minimum length of bonding wire by moving the bonding capillary the shortest feasible distance over the surface of the support 204. As a consequence, the looping of wires 210 can cross the support at a low height and approach the pad surface at a low angle. At the stitch, there is no minimum height for a ball needed, nor is there a heat-affected wire zone, which would be mechanically weak for bending or other deformation stresses. Further, because of this minimum wire looping, high looping spans are no longer an issue, and the lid can be placed at close distance over the micromechanical components, resulting in a thin packaged device.

After the coupling members are connected, the micromechanical components can be activated and the package cleaned. In the case of micromirror devices, the activation consists of removing the photoresist under the mirrors (more detail can be found, for example, in U.S. Pat. No. 5,936,758, referenced above). The cleaning process of the package and further activation of the components employs either a plasma etch or a combination of a plasma etch/UV cure process. Any contamination is removed from the surfaces 205a of the plastic substrate and the surfaces of the components 202.

The laminated construction of the substrate from plastic layers make it easy to create ridge-like protrusions, such as indicated by 111 in FIG. 1 and 211 in FIG. 2. These protrusions are located at a lower level than surface 205a and may, for example, be a part of the substrate used for the routing lines. They may be given various geometrical shapes, for instance the shape of a frame resembling the contours of the chip 101. In a function important for the micromechanical components, these protrusions serve as storing places for chemical compounds intended to remain inside the package volume after completely closing the opening by lid 220. These chemicals are typically supplied as pills or granular material. In FIGS. 1 and 2, they are generally designated 130 and 230, respectively.

For micromirror devices, such chemicals are suitable for releasing passivants continuously for the lifetime of the device in order to coat all contacting surfaces of the micromechanical devices. More detail about composition, operation and method of metered deposition can be found in the above-quoted U.S. Pat. Nos. 5,939,785 and 5,936,758.

Right after the deposition of any chemical compound, a lid 220 (see FIG. 2) is attached to the first surface 205a of the substrate, thereby closing a second level of the substrate opening. Typically, lid 220 has to be cleaned from impurities and dehydrated by baking in reduced-pressure environment before attachment. After the cleaning, they are attached to the smooth, flat surfaces 205b of the substrate preferably using an epoxy adhesive. Temperature and time needed to polymerize the adhesive also serve to sublimate an amount of the passivant 230 within the package so that the active surfaces of the micromechanical components are coated with at least a monolayer of the passivant.

For micromirror devices, lid 220 is a plate made of glass or any other material transparent to light in the visible range of the electromagnetic spectrum. Requirements for optical flatness of the plate are described in quoted U.S. Pat. No. 5,939,785. Care has to be taken that attached lid 220 is in a plane parallel to the plane of the plurality of micromirrors 202.

The packaged micromechanical devices may be marked with identification code on some appropriate location of the package. Included in the identification code are commonly device type and number, fabrication information, country of origin, specific device characteristics, etc.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. As an example, the material of the semiconductor chip may comprise silicon, silicon germanium, gallium arsendide, or any other semiconductor material used in manufacturing. As another example, the number of plastic layers used for laminating the substrate may be larger than two, providing a multi-level routing substrate for wire bonding in more than one level.

As another example, the combined heights consumed for chip assembly, support, plastic frame and lid can be minimized in order to reduce the thickness of the packaged device. The invention can thus be applied to the manufacture of "thin" land grid or ball grid array packages. It is therefore intended that the appended claims encompass any such modifications or embodiments.

I claim:

1. A packaged micromechanical device, comprising:
   a semiconductor chip having an integrated circuit including a plurality of micromechanical components configured in a plane in the central portion of said chip, and a plurality of bonding pads disposed in peripheral portions of said chip;
   a support having central and peripheral areas, said chip adhered to said central area;
   a laminated plastic substrate having at least two layers which form an opening, first and second surfaces, and a plurality of electrically conductive routing lines integral with said layers;
   said second surface adhered to said peripheral area of said support such that one level of said opening is closed;
   a plurality of terminals disposed on said second surface, at least one of said terminals electrically connected to at least one of said routing lines;
   said first surface being flat and in a plane parallel to said plane of said components;
   coupling members electrically connecting at least one of said bonding pads to at least one of said routing lines; and
   a lid adhered to said first surface in a plane parallel to said plane of said components, whereby a second level of said opening is closed.

2. The packaged device according to claim 1 wherein said micromechanical device is a digital micromirror device.

3. The packaged device according to claim 1 wherein said micromechanical components are micromirrors.

4. The packaged device according to claim 1 wherein said support is thermally conductive and is a heat sink.

5. The packages device according to claim 1 wherein said routing lines are patterned between said layers.

6. The packaged device according to claim 1 wherein said plastic substrate is selected from a group consisting of polyimides or epoxies, and sheet-like boards made of FR-4, FR-5, BT resin, or glass-fiber strengthened dielectrics.

7. The packaged device according to claim 1 wherein said coupling members are bonding wires or ribbons.

8. The packaged device according to claim 1 further providing ridge-like protrusions formed by said plastic substrate and positioned under said lid, suitable for storing chemical compounds.

9. The packaged device according to claim 8 wherein said chemical compounds are suitable for releasing passivants continuously to coat contacting surfaces of said micromechanical components.

10. The packaged device according to claim 1 wherein said lid is a plate made of glass or any other material transparent to light in the visible range of the electromagnetic spectrum.

11. The packaged device according to claim 1 wherein said plate is adhered to said flat surface of said substrate by an epoxy adhesive.

12. The packaged device according to claim 1 further having a solder ball disposed on at least one of said terminals.

* * * * *